(12) United States Patent
Ha

(10) Patent No.: US 11,540,430 B2
(45) Date of Patent: Dec. 27, 2022

(54) DISPLAY DEVICE

(71) Applicant: LG Display Co., Ltd., Seoul (KR)

(72) Inventor: Da-Hye Ha, Gyeongsangbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 194 days.

(21) Appl. No.: 17/134,235

(22) Filed: Dec. 25, 2020

(65) Prior Publication Data
US 2021/0204455 A1 Jul. 1, 2021

(30) Foreign Application Priority Data

Dec. 26, 2019 (KR) .................. 10-2019-0175414

(51) Int. Cl.
*H05K 7/20* (2006.01)
*H01L 33/64* (2010.01)
*H05K 7/14* (2006.01)
*H05K 5/00* (2006.01)
*H01L 51/52* (2006.01)

(52) U.S. Cl.
CPC ....... *H05K 7/20963* (2013.01); *H01L 33/642* (2013.01); *H01L 51/529* (2013.01); *H05K 5/0017* (2013.01); *H05K 7/1427* (2013.01)

(58) Field of Classification Search
CPC ................................................. H05K 7/20963
See application file for complete search history.

(56) References Cited

U.S. PATENT DOCUMENTS 8,072,778 B2 * 12/2011 Kunimoto ............ H05K 9/0054
439/247
2017/0045916 A1 * 2/2017 Kim ...................... H01Q 1/48

FOREIGN PATENT DOCUMENTS

JP 2011164644 * 8/2011 ............... G09F 9/00

* cited by examiner

*Primary Examiner* — Mukundbhai G Patel
(74) *Attorney, Agent, or Firm* — Polsinelli PC

(57) ABSTRACT

A display device includes a display panel, a heat radiation metal plate arranged on a rear surface or a side surface of the display panel, a printed circuit board arranged on a rear surface of the heat radiation plate so as to be connected to the display panel, and a conductive tape configured to cover the heat radiation plate and the printed circuit board. The conductive tape conductively connects the rear surface of the heat radiation plate to a ground terminal of the printed circuit board.

12 Claims, 3 Drawing Sheets

DISPLAY DEVICE

CROSS-REFERENCE TO RELATED APPLICATION

This application claims the benefit of Korean Patent Application No. 10-2019-0175414, filed on Dec. 26, 2019, which is hereby incorporated by reference in its entirety.

BACKGROUND

Field of the Disclosure

The present disclosure relates to a display device, and more particularly, to a display device which may prevent a printed circuit board arranged on the rear surface of a display panel from being damaged due to static electricity or electromagnetic waves.

Discussion of the Background

Image displays, which display various pieces of information through a screen, are core technology of the information and communication age, and are being developed towards thinness, light weight and high performance. Accordingly, as flat panel displays which have reduced weight and volume and thus overcome the drawbacks of cathode ray tubes (CRTs), a liquid crystal display which implements an image by receiving light from a light source, an electroluminescent display which emits light intrinsically without any light source unit, etc. are being spotlighted.

In these displays, a plurality of pixels is arranged in a matrix, thus displaying an image. Here, each pixel includes a light emitting diode, and a pixel driving circuit including a plurality of transistors configured to independently drive the light emitting diode.

Recently, research on thin and light display panels is actively being conducted, and display devices in which display panels are bendable into a curved surface or be foldable and non-foldable are being supplied.

However, as display devices are developed to satisfy miniaturization and thinness, it is difficult to prevent generation of static electricity or electromagnetic waves from display panels or circuit boards or to ground display panels or circuit boards.

SUMMARY

Accordingly, the present disclosure is directed to a display device that substantially obviates one or more problems due to limitations and disadvantages of the prior art.

The present disclosure is also to provide a display device which may use a heat radiation plate, formed of metal and arranged on the rear surface or a side surface of a display panel, as a ground path of a printed circuit board.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve the above and other advantages and in accordance with the purpose of the disclosure, as embodied and broadly described herein, a display device includes a display panel, a heat radiation plate formed of metal and arranged on a rear surface or a side surface of the display panel, a printed circuit board arranged on a rear surface of the heat radiation plate so as to be connected to the display panel, and a conductive tape configured to cover the heat radiation plate and the printed circuit board, wherein the conductive tape conductively connects the rear surface of the heat radiation plate to a ground terminal of the printed circuit board.

The heat radiation plate may include a black coating layer configured to cover at least the rear surface thereof, and the conductive tape may be adhered to at least one first opening formed through the black coating layer so as to expose at least a portion of the heat radiation plate.

The display device may further include a guide panel interposed between the heat radiation plate and the conductive tape.

The guide panel may include a substrate recess formed so as to expose the printed circuit board inserted thereinto, and a notch region formed adjacent to the substrate recess so as to expose the at least one first opening.

The display device may further include a mid-frame arranged on a rear surface of the guide panel.

The guide panel may include at least one second opening formed through the black coating layer to expose the heat radiation plate.

The mid-frame may include a ground member configured to pass through the second opening and then to protrude so as to contact the second opening.

In another aspect of the present disclosure, a display device includes a display panel, a heat radiation plate formed of metal and arranged on a rear surface or a side surface of the display panel, a printed circuit board arranged on a rear surface of the heat radiation plate so as to be connected to the display panel, a first opening formed by removing a predetermined region of a black coating layer formed on the rear surface of the heat radiation plate, and a connector conductively connected to a ground terminal of the printed circuit board and the rear surface of the heat radiation plate formed through the first opening.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspect(s) of the disclosure and together with the description serve to explain the principle of the disclosure.

In the drawings.

DETAILED DESCRIPTION

Figure 1:
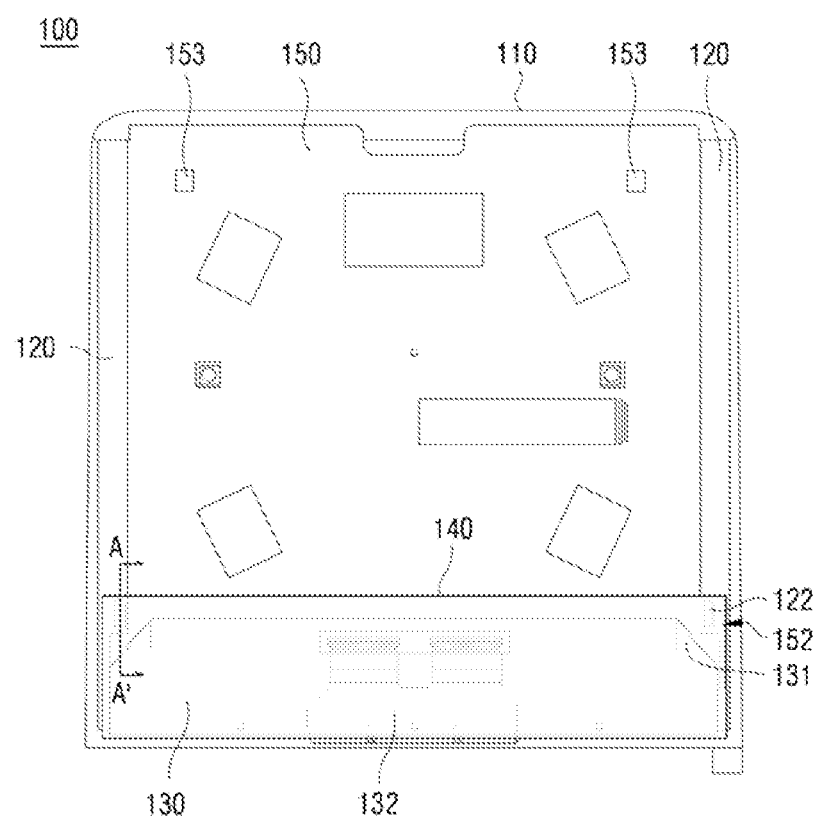
FIG. 1 is a rear view of a display device according to one aspect of the present disclosure.

Reference will now be made in detail to the aspects of the present disclosure, examples of which are illustrated in the accompanying drawings. In the drawings, the same or similar elements are denoted by the same reference numerals even when they are depicted in different drawings. In the following description of the present disclosure, a detailed description of known functions and configurations incorporated herein will be omitted when it may make the subject matter of the present disclosure rather unclear. In addition, those skilled in the art will appreciate that some features shown in the drawings can be exaggerated, reduced or simplified for ease in illustration, and the drawings and elements shown in the drawings are not necessarily illustrated at an appropriate scale.

In the present disclosure, "display devices" may include, in a narrow sense, display devices, each of which includes a display panel and a driving unit to drive the display panel, such as a liquid crystal module (LCM) and an organic light emitting diode (OLED) display module. Further, "display devices" may include complete products (i.e., finished products) including an LCM, an OLED display module, etc., such as a notebook computer, a TV, a computer monitor and an automotive display, other equipment display devices for vehicles, and set electronic devices or set devices (i.e., set apparatuses), such as a mobile electronic device, i.e., a smartphone or an electronic pad.

Figure 2:
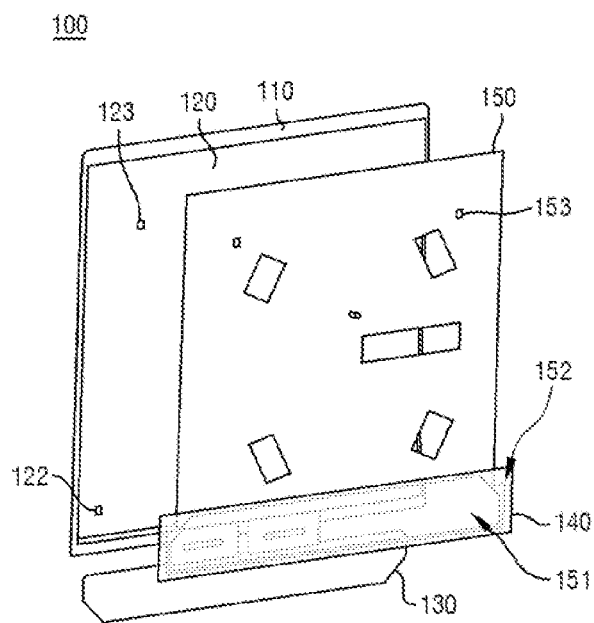
FIG. 2 is an exploded perspective view of the display device shown in FIG. 1.

FIG. 1 is a rear view of a display device according to one aspect of the present disclosure, and FIG. 2 is an exploded perspective view of the display device shown in FIG. 1.

Referring to FIGS. 1 and 2, a display device 100 according to this aspect of the present disclosure may include a display panel 110, a heat radiation plate 120, a printed circuit board 130, a conductive tape 140 and a guide panel 150.

First, as the display panel 110, all types of display panels, such as a liquid crystal display panel, an electroluminescent display panel, etc., may be used. For example, as the electroluminescent display panel, an organic light emitting diode (OLED) display panel, a quantum-dot light emitting diode (QLED) display panel or an inorganic light emitting diode display panel may be used.

For example, when a liquid crystal display panel is used as the display panel 110, the display panel 110 includes a plurality of gate lines, a plurality of data lines, and pixels formed at intersections between the gate lines and the data lines. Further, the display panel 110 may include an array substrate including thin film transistors which are switching elements for respectively adjusting light transmittance in the pixels, an upper substrate having a color filter and/or a black matrix, and a liquid crystal layer formed between the array substrate and the upper substrate.

Alternatively, when an OLED display panel is used as the display panel 110, the display panel 110 includes a plurality of gate lines, a plurality of data lines, and pixels formed at intersections between the gate lines and the data lines. Further, the display panel 110 may include an array substrate including thin film transistors which are elements for selectively applying voltage to the respective pixels, an organic light emitting diode (OLED) layer formed on the array substrate, and an encapsulation substrate arranged on the array substrate so as to cover the OLED layer. The encapsulation substrate may protect the thin film transistors and the OLED layer from external impacts, and prevent moisture or oxygen from permeating the OLED layer.

A layer formed on the array substrate may include an inorganic light emitting layer, for example, a nano-sized material layer or quantum dots.

Further, a pad part (not shown) connected to respective signal lines provided in a pixel array may be provided at one side of the edge of the array substrate, and the pad part is connected to a circuit board which drives the display panel 110. Although not shown in the drawings, a separate back plate may be adhered to the rear surface of the array substrate.

The display panel 110 may include a touch panel arranged on the array substrate. Here, the touch panel and a polarizing film may be further provided on the upper surface of the array substrate. The polarizing film may prevent reflection of light entering from the outside and thus provide a function of improving visibility of the display panel 110. The touch panel may sense a user touch signal.

A light control film (LCF) may be provided on the touch panel. The LCF may adjust the angle of light emitted from the display panel 110 and thus prevent a viewing angle from increasing in an unnecessary direction. A cover window (not shown) may be provided at the outermost part of the display panel 110. A cover glass formed of glass and a cover plastic formed of plastic may be used as the cover window.

A transparent adhesive layer may be arranged between the polarizing film and the touch panel, between the touch panel and the LCF, and between the LCF and the cover window. A pressure sensitive adhesive (PSA) including an optically clear adhesive (OCA) or an optically clear resin (OCR) for UV hardening may be applied to these adhesive layers.

Hereinafter, an electroluminescent display panel used as the display panel 110 will be exemplarily described. However, the present disclosure is not limited thereto. For example, among electroluminescent display panels, a quantum-dot light emitting diode (QLED) display panel, an organic light emitting diode (LED) display panel or an inorganic light emitting diode display panel may be used as the display panel 110.

The heat radiation plate 120 is bonded to the rear surface or the side surface of the display panel 110. As shown in FIG. 2, the heat radiation plate 120 is adhered so as to cover almost the entirety of the rear surface of the display panel 110. An adhesive layer is provided between the display panel 110 and the heat radiation plate 120, and the display panel 110 and the heat radiation plate 120 may be bonded using the adhesive layer by applying pressure thereto while feeding the display panel 110 and the heat radiation plate 120 between rotating rolls.

The heat radiation plate 120 may have a shape corresponding to the shape of the display panel 110, and be formed of aluminum or copper having excellent thermal conductivity. Of course, the shape of the heat radiation plate 120 and the material for the heat radiation plate 120 are not limited thereto. For example, the heat radiation plate 120 may have a shape corresponding to the position or structure of the printed circuit board 130 coupled to the rear surface of the display panel 110 or the heat radiation plate 120. Further, the heat radiation plate 120 may be formed of at least one of other materials having excellent thermal conductivity, i.e., at least one of gold, silver, magnesium, aluminum, carbon fiber, graphite and graphene. Alternatively, the heat radiation plate 120 may be formed of an alloy of these materials.

A black coating layer 121 (see FIG. 3) is provided on the surface of the heat radiation plate 120. The black coating layer 121 may be provided so as to prevent the influence of the intrinsic metallic color of the heat radiation plate 120 on the appearance of the display device 100, and may also serve to improve a heat radiation effect because the black coating layer 121 includes a material assisting heat radiation.

The printed circuit board 130 may transmit a data signal and a driving control signal, input from the outside, to the display panel 110. A flexible printed circuit board (FPCB) 132 which connects the printed circuit board 130 to the display panel 110 may be provided between the display panel 110 and the printed circuit board 130. The FPCB 132 may include a flexible printed circuit (FPC) or a film having wiring thereon, and be bendable or foldable.

In this aspect of the present disclosure, the printed circuit board 130 is arranged on the rear surface of the heat radiation plate 120, as shown in FIG. 1. Here, the FPCB 132 is bent into an approximately U-shape between the display panel 110 and the printed circuit board 130. A ground terminal 131 is provided at one side end or both side ends of the printed circuit board 130. The display panel 110 or the printed circuit board 130 may be damaged due to electromagnetic interference (EMI) or electrostatic discharge (ESD), and thereby be defected. Such a defect may occur through static electricity due to charges accumulated, between the display panel 110 and the printed circuit board (including driving elements) 130 or between the display panel 110 and a system for holding the display panel 110, or caused by a human body carrying unsafe static charges, and the ground terminal 131 may provide a path along which this static electricity is discharged to the outside so as to ground the display panel 110.

The ground terminal 131 may be connected to the heat radiation plate 120 formed of metal, thus being capable of forming the ground path.

If no black coating layer 121 is provided on the heat radiation plate 120, the ground terminal 131 may be conductively connected directly to the heat radiation plate 120 so as to achieve grounding.

However, if the black coating layer 121 is provided on the heat radiation plate 120, a first opening 122 may be formed by removing at least a portion of the black coating layer 121 on the rear surface of the heat radiation plate 120 and thus form a ground path with the ground terminal 131, because the black coating layer 121 is formed of an insulating material. That is, the first opening 122 corresponds to a region in which a portion of the black coating layer 121 is removed using a laser so as to expose at least a portion of the heat radiation plate 120.

Here, the black coating layer 121 may be formed by applying paint to the heat radiation plate 120 and then drying the paint, laminating a film on the heat radiation plate 120, or coating the heat radiation plate 120 with a resin. For example, during lamination or coating, vinyl chloride monomer (VCM) having excellent barrier properties, mechanical strength, thermal adhesion, gloss, etc. may be used. Of course, polyethylene (PE), polypropylene (PP), polystyrene (PS), polyvinyl chloride (PVC), polyester (PET), polyamide (PA), polycarbonate (PC), etc. may be used.

Figure 3:
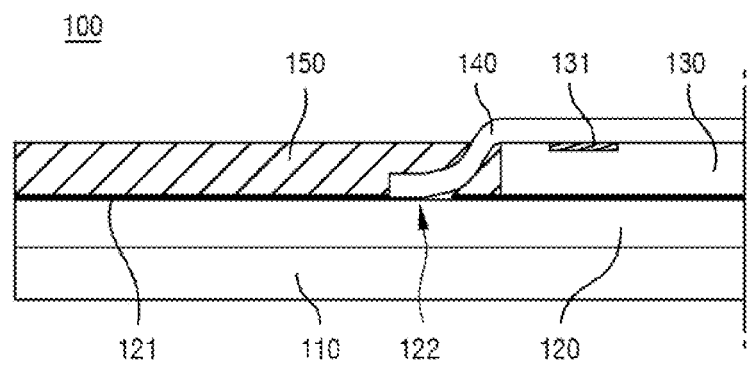
FIG. 3 is a cross-sectional view taken along line A-A' of the display device shown in FIG. 1.

FIG. 3 is a cross-sectional view taken along line A-A' of the display device shown in FIG. 1.

The heat radiation plate 120 is arranged on the rear surface of the display panel 110, the black coating layer 121 is provided on the rear surface of the heat radiation plate 120, and the printed circuit board 130 is arranged on the rear surface of the black coating layer 121.

A conductive tape 140 is adhered to the first opening 122 formed by removing the black coating layer 121 adjacent to the ground terminal 131 formed on the printed circuit board 130, and conductively connects the ground terminal 131 and the rear surface of the heat radiation plate 120 formed through the first opening 122, thereby forming a ground path. Of course, the ground path may be implemented in a plurality of regions. Although not shown in the drawings, portions of the conductive tape 140 which contact or are adhered to remaining regions except for the ground terminal 131 and the first opening 122 may be formed of an insulating material. The conductive tape 140 may also be one of the connector that conductively connects the ground terminal 131 and the heat radiation plate 120. Thus conductive tape 140 can be an example of one of the various types of connectors.

Further, the guide panel 150 is provided on the rear surface of the heat radiation plate 120. The guide panel 150 may be a part which mechanically couples the display panel 110 to a system to which the display panel 110 will be held (for example, a monitor, a navigation system, an instrument board for vehicles, etc.). Referring to FIGS. 2 and 3, the guide panel 150 includes a substrate recess 151 into which the printed circuit board 130 is inserted, and a notch region 152 formed adjacent to the substrate recess 151 so as to expose the first opening 122.

The substrate recess 151 may have a structure which supports the printed circuit board 130 on the guide panel 150 or a structure through which the printed circuit board 130 passes so as to be adhered to the rear surface of the heat radiation plate 120. As shown in FIG. 2, the substrate recess 151 may have an opening structure through which the printed circuit board 130 passes. Although not shown in the drawings, a diaphragm may be provided within the substrate recess 151 so that the printed circuit board 130 is arranged on the heat radiation plate 120 separately from the heat radiation plate 120.

Figure 4:
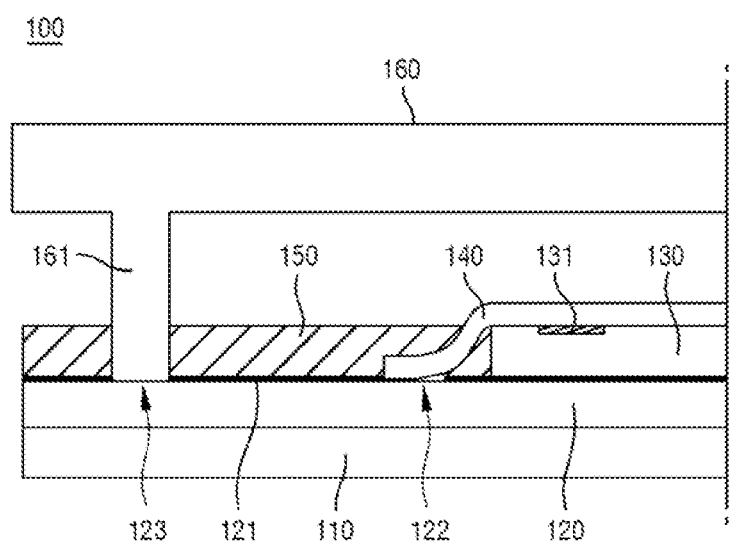
FIG. 4 is a cross-sectional view of a display device according to another aspect of the present disclosure.

FIG. 4 is a cross-sectional view of a display device according to another aspect of the present disclosure. Some parts in this aspect which are substantially the same as those in the former aspect are denoted by the same reference numerals even though they are depicted in different drawings.

Referring to FIG. 4, a display device 100 according to this aspect of the present disclosure includes a display panel 110, a heat radiation plate 120, a printed circuit board 130, a conductive tape 140, a guide panel 150 and a mid-frame 160.

A black coating layer 121 is provided on the outer surface of the heat radiation plate 120, and the conductive tape (or adhesive tape) 140 may be adhered to a ground terminal 131 of the printed circuit board 130 and to a first opening 122 in the heat radiation plate 120 so as to form a ground path.

Separately, a ground member 161 is provided on the mid-frame 160, and the ground member 161 passes through a second opening 123 formed in the guide plate 150 and then protrudes so as to contact the second opening 123, thus forming another ground path. At least one second opening 123 may be formed through the black coating layer 121 to expose the heat radiation plate 120. Here, the ground member 161 may be formed of metal and be connected to another element formed of metal, or the mid-frame 160 may be formed of metal.

These ground paths may include a first ground path formed by conductively connecting the first opening 122 and the ground terminal 131 by the conductive tape 140 and a second ground path formed through contact between the second opening 123 and the ground member 161, and may be selectively used depending on the purpose or coupling structure of the display panel 110. Of course, as shown in FIG. 4, both the first ground path and the second ground path may be used.

In FIG. 4, the mid-frame 160 may be a mechanical element of one of an equipment display device, an electronic device and a set device for holding the display panel 110, as described above. Therefore, the mid-frame 160 may be replaced with a bottom cover or a bottom case.

In the display device 100 according to the present disclosure, the heat radiation plate 120 may improve the heat radiation performance of the display device 100 and simultaneously a portion of the black coating layer 121 of the heat radiation plate 120 may be removed to be used as a ground path of the printed circuit board 130, and the heat radiation plate 120 may be formed wide to be arranged throughout the rear surface of the display panel 110 and thus selectively provide various ground paths.

As is apparent from the above description, a display device in accordance with the present disclosure has the following effects.

First, a heat radiation plate may improve the heat radiation performance of the display device, and simultaneously, a portion of a black coating layer of the heat radiation plate may be removed to be used as a ground path of a printed circuit board.

Second, the heat radiation plate may be formed wide to be arranged throughout the rear surface of a display panel, thus being capable of selectively providing various ground paths.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device comprising:
   a display panel;
   a heat radiation plate arranged on a rear surface or a side surface of the display panel;
   a printed circuit board arranged on a rear surface of the heat radiation plate and connected to the display panel;
   a conductive tape configured to cover the heat radiation plate and the printed circuit board; and
   a guide panel interposed between the heat radiation plate and the conductive tape,
   wherein the conductive tape conductively connects the rear surface of the heat radiation plate to a ground terminal of the printed circuit board,
   wherein the heat radiation plate includes a black coating layer configured to cover at least the rear surface thereof, and
   wherein the conductive tape is adhered to at least one first opening formed through the black coating layer that exposes at least a portion of the heat radiation plate.

2. The display device according to claim 1, wherein the guide panel comprises: a substrate recess exposing the printed circuit board inserted thereinto; and a notch region disposed adjacent to the substrate recess and exposing the at least one first opening.

3. The display device according to claim 1, further comprising a mid-frame arranged on a rear surface of the guide panel.

4. The display device according to claim 3, wherein the guide panel comprises at least one second opening formed through the black coating layer that exposes the heat radiation plate.

5. The display device according to claim 4, wherein the mid-frame includes a ground member configured to pass through the second opening and protrudes to contact the second opening.

6. The display device according to claim 1, wherein the heat radiation metal plate is arranged throughout the rear surface of the display panel.

7. The display device according to claim 1, wherein the conductive tape has portion adhered to remaining regions except for the ground terminal.

8. The display device according to claim 7, wherein the at least one first opening includes an insulating material.

9. The display device according to claim 2, further comprising a diaphragm provided within the substrate recess so that the printed circuit board is arranged on the heat radiation meal plate separately from the heat radiation plate.

10. A display device comprising:
    a display panel;
    a heat radiation plate arranged on a rear surface or a side surface of the display panel;
    a printed circuit board arranged on a rear surface of the heat radiation plate and connected to the display panel;
    a first opening disposed in the rear surface of the heat radiation plate; and
    a connector conductively connected to a ground terminal of the printed circuit board to the rear surface of the heat radiation plate formed through the first opening; and
    a guide panel disposed on the heat radiation plate,
    wherein the first opening is formed by removing a predetermined region of a black coating layer of the rear surface of the heat radiation plate.

11. The display device according to claim 9, wherein the heat radiation metal plate is arranged throughout the rear surface of the display panel.

12. The display device according to claim 9, wherein the connector has portions adhered to remaining regions except for the ground terminal and the first opening is formed of an insulating material.

* * * * *